US009000690B2

(12) United States Patent
Garg et al.

(10) Patent No.: US 9,000,690 B2
(45) Date of Patent: Apr. 7, 2015

(54) DRIVER FOR CAPACITIVE LOADS

(75) Inventors: Mayank Garg, Richardson, TX (US);
David J. Baldwin, Allen, TX (US);
Boqiang Xiao, Dallas, TX (US)

(73) Assignee: Texas Instruments Incorporated,
Dallas, TX (US)

( * ) Notice: Subject to any disclaimer, the term of this patent is extended or adjusted under 35 U.S.C. 154(b) by 293 days.

(21) Appl. No.: 13/495,951

(22) Filed: Jun. 13, 2012

(65) Prior Publication Data

US 2013/0334987 A1  Dec. 19, 2013

(51) Int. Cl.
*H01L 41/04* (2006.01)
*H03K 3/00* (2006.01)
*B06B 1/02* (2006.01)

(52) U.S. Cl.
CPC ............ *B06B 1/0238* (2013.01); *H01L 41/042* (2013.01)

(58) Field of Classification Search
USPC ........................................................ 318/114
See application file for complete search history.

(56) References Cited

U.S. PATENT DOCUMENTS

| 6,087,863 | A | 7/2000 | Aflatouni | |
|---|---|---|---|---|
| 7,952,900 | B2 * | 5/2011 | Tomiyoshi et al. | 363/98 |
| 8,305,061 | B1 * | 11/2012 | Zhang et al. | 323/283 |
| 2007/0064955 | A1 | 3/2007 | Saito | |
| 2007/0273437 | A1 | 11/2007 | Kaiho et al. | |
| 2008/0204914 | A1 * | 8/2008 | Hashizume | 360/46 |
| 2009/0027925 | A1 * | 1/2009 | Kanouda et al. | 363/21.13 |
| 2009/0262556 | A1 * | 10/2009 | Tomiyoshi et al. | 363/17 |
| 2010/0156368 | A1 * | 6/2010 | Huynh et al. | 323/282 |
| 2011/0235831 | A1 | 9/2011 | Kaiho et al. | |
| 2011/0305356 | A1 * | 12/2011 | Kwan et al. | 381/190 |

FOREIGN PATENT DOCUMENTS

WO   WO2009029563   3/2009

* cited by examiner

*Primary Examiner* — Paul Ip
*Assistant Examiner* — Devon Joseph
(74) *Attorney, Agent, or Firm* — Alan A. R. Cooper; Frank D. Cimino

(57) ABSTRACT

A method for driving a piezoelectric transducer is provided. An input signal is received. At least one of a plurality of modes is selected for a buck-boost stage from a comparison of a desired voltage on a capacitor to a first threshold and a second threshold, where the desired voltage is determined from the input signal. The piezoelectric transducer is then driven substantially within the audio band using the desired voltage on the capacitor using an H-bridge that changes state with each zero-crossing.

10 Claims, 6 Drawing Sheets

DRIVER FOR CAPACITIVE LOADS

TECHNICAL FIELD

The invention relates generally to a driver for capacitive loads and, more particularly, to a driver that is configured to drive a piezoelectric transducer in the audio band.

BACKGROUND

In many applications, there is a desire to increase robustness and decrease cost. One application with this desire is mobile space devices, and one avenue to both, reduce costs and increase robustness, is to change the human interface portion of the mobile device, namely, by collapsing speaker and haptics functionality. To accomplish this, a piezoelectric transducer can be secured to a screen so as to vibrate the screen so as to allow the screen to function as a speaker or function as a touch screen with haptics feedback (e.g., vibratory feedback indicating a button touch).

One issue, however, is that piezoelectric transducers are generally highly capacitive loads (e.g., 1 µF), and it can be difficult to drive these transducers with sufficient quality to function as a speaker and enough power to provide a haptics effect. The best conventional technique for driving such a capacitive load employs a class G or class H boost stage with a class D amplifier. As shown in FIG. 1, this type of conventional circuit can use an average battery current of about 110 mA to drive a capacitive load of 1 µF at 10 kHz and $20V_{pp}$ with a battery voltage of about 3.6V. This particular technique, though, generally employs multiple large and expensive components (such as multiple inductors), causing this technique to be prohibitively expensive.

Therefore, there is a need for an improved driver for capacitive loads.

Another example of a conventional system is PCT Publ. No. WO2009/029563.

SUMMARY

An embodiment of the present invention, accordingly, provides an apparatus. The apparatus comprises a supply terminal; a first switching terminal; a second switching terminal, wherein the first and second switching terminals are configured to be coupled to an inductor; a boost terminal that is configured to be coupled to a capacitor; a first output terminal; a second output terminal, wherein the first and second output terminals are configured to be coupled to a piezoelectric transducer; a first H-bridge that is coupled to the supply terminal, the boost terminal, the first switching terminal, and the second switching terminal; a second H-bridge that is coupled to the boost terminal, the first output terminal, and the second output terminal; and a control circuit that is coupled to control the first and second H-bridges, wherein the control circuit is configured to operate the first H-bridge as a buck-boost circuit, and wherein the control circuit is configured to operate the first and second H-bridges to drive substantially within the audio band.

In accordance with an embodiment of the present invention, the control circuit is configured to operate the first H-bridge in a buck mode when a desired voltage on the capacitor is less than a first threshold voltage, in a boost mode when the desired voltage on the capacitor is greater than a second threshold voltage, and in a buck-boost mode when the desired voltage on the capacitor is between the first and second threshold voltages.

In accordance with an embodiment of the present invention, the first H-bridge further comprises first, second, third, and fourth switches, and wherein the second H-bridge further comprises fifth, sixth, seventh, and eighth switches.

In accordance with an embodiment of the present invention, the control circuit further comprises: a zero-crossing detector that is coupled to the first and second output terminals; a bridge controller that is coupled to zero-crossing circuit; and a driver that is coupled to the bridge controller, the fifth switch, the sixth switch, the seventh switch, and the eighth switch.

In accordance with an embodiment of the present invention, the driver further comprises a first driver, and wherein the control circuit further comprises: a buck-boost detector that is coupled to the first and second switching terminals; a buck-boost controller that is coupled to the buck-boost detector; a pulse width modulator (PWM) that is coupled to the buck-boost controller; and a second driver that is coupled to the PWM, the first switch, the second switch, the third switch, and the fourth switch.

In accordance with an embodiment of the present invention, a method is provided. The method comprises receiving an input signal; selecting at least one of a plurality of modes for a buck-boost stage from a comparison of a desired voltage on a capacitor to a first threshold and a second threshold, wherein the desired voltage is determined from the input signal; driving a piezoelectric transducer substantially within the audio band using the desired voltage on the capacitor using an H-bridge that changes state with each zero-crossing.

In accordance with an embodiment of the present invention, the step of selecting at least one of the plurality of modes further comprises selecting a buck mode if the desired voltage on the capacitor is less than the first threshold.

In accordance with an embodiment of the present invention, the step of selecting at least one of the plurality of modes further comprises selecting a boost mode if the desired voltage on the capacitor is greater than the second threshold.

In accordance with an embodiment of the present invention, the step of selecting at least one of the plurality of modes further comprises selecting a buck-boost mode if the desired voltage on the capacitor is between the first and second thresholds.

In accordance with an embodiment of the present invention, the step of selecting at least one of the plurality of modes further comprises selecting a buck charging mode if the desired voltage on the capacitor is less than the first threshold, when building a charge on the capacitor.

In accordance with an embodiment of the present invention, the step of selecting at least one of the plurality of modes further comprises selecting a boost charging mode if the desired voltage on the capacitor is greater than the second threshold, when building a charge on the capacitor.

In accordance with an embodiment of the present invention, the step of selecting at least one of the plurality of modes further comprises selecting a buck-boost charging mode if the desired voltage on the capacitor is between the first and second thresholds, when building a charge on the capacitor.

In accordance with an embodiment of the present invention, the step of selecting at least one of the plurality of modes further comprises selecting a buck discharging mode if the desired voltage on the capacitor is less than the first threshold, when recovering a charge from the capacitor.

In accordance with an embodiment of the present invention, the step of selecting at least one of the plurality of modes further comprises selecting a boost discharging mode if the desired voltage on the capacitor is greater than the second threshold, when recovering a charge from the capacitor.

In accordance with an embodiment of the present invention, the step of selecting at least one of the plurality of modes further comprises selecting a buck-boost discharging mode if the desired voltage on the capacitor is between the first and second thresholds, when recovering a charge from the capacitor.

In accordance with an embodiment of the present invention, an apparatus is provided. The apparatus comprises a host processor; a cell; a capacitor that is coupled to the cell; an inductor; a piezoelectric transducer; and a piezoelectric driver having: an input terminal that is coupled to the host processor; a first supply terminal that is coupled to the cell; a second supply terminal that is coupled to the cell; a first switching terminal that is coupled to the inductor; a second switching terminal that is coupled to the inductor; a boost terminal that is coupled to the capacitor; a first output terminal that is coupled to the piezoelectric transducer; a second output terminal that is coupled to the piezoelectric transducer; a first H-bridge that is coupled to the first supply terminal, the second supply terminal, the boost terminal, the first switching terminal, and the second switching terminal; a second H-bridge that is coupled to the boost terminal, the second supply terminal, the first output terminal, and the second output terminal; and a control circuit that is coupled to control the first and second H-bridges, wherein the control circuit is configured to operate the first H-bridge as a buck-boost circuit, and wherein the control circuit is configured to operate the first and second H-bridges to drive substantially within the audio band.

In accordance with an embodiment of the present invention, the piezoelectric transducer is coupled to a screen, and wherein the driver further comprises a first driver, and wherein the control circuit further comprises: a buck-boost detector that is coupled to the first and second switching terminals; a buck-boost controller that is coupled to the buck-boost detector; a PWM that is coupled to the buck-boost controller; a second driver that is coupled to the PWM, the first switch, the second switch, the third switch, and the fourth switch; and an interface circuit that is coupled to the buck-boost controller and the host controller.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
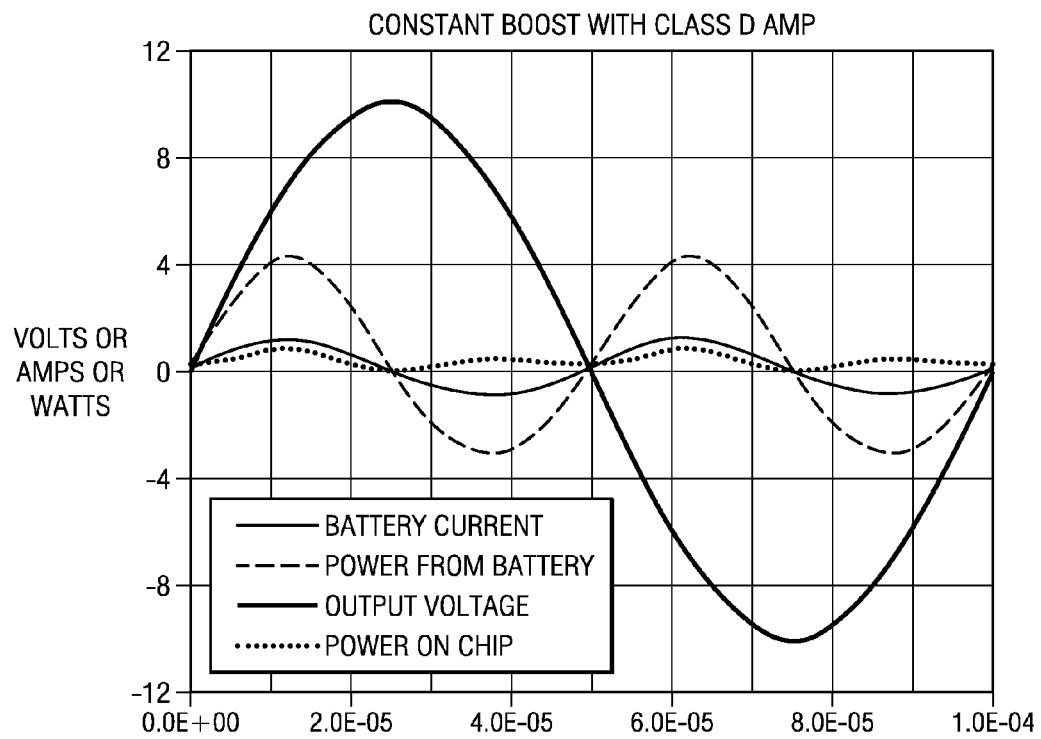
FIG. 1 is a diagram depicting the operation for a conventional driver.

Refer now to the drawings wherein depicted elements are, for the sake of clarity, not necessarily shown to scale and wherein like or similar elements are designated by the same reference numeral through the several views.

Figure 3:
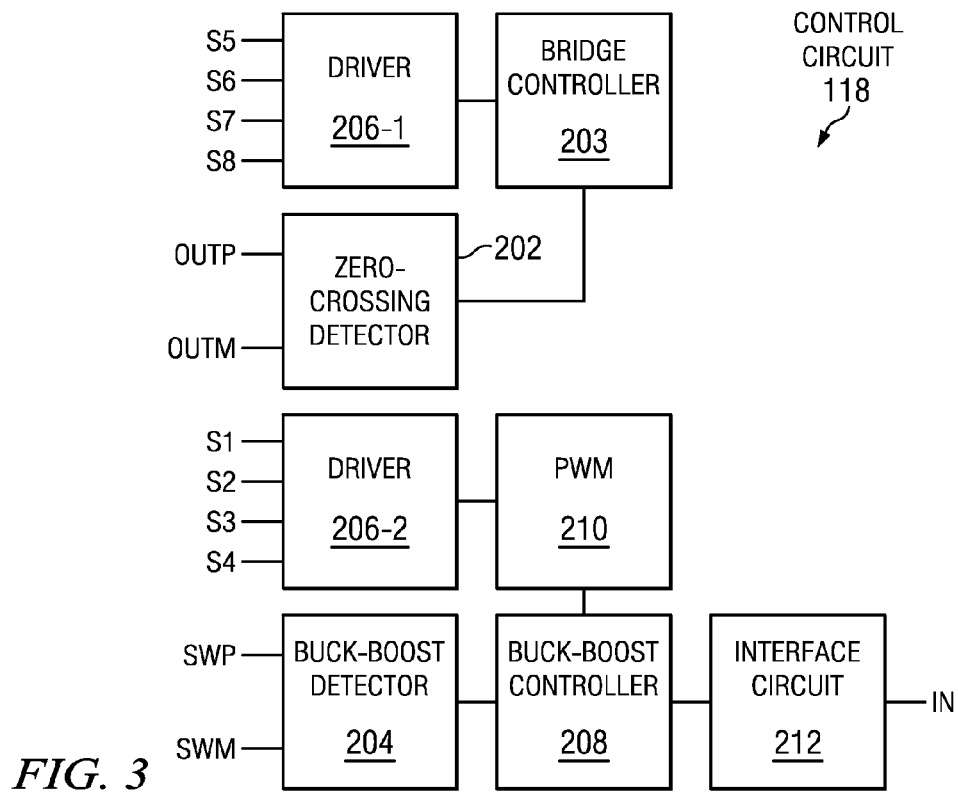
FIG. 3 is a diagram of an example of the control circuit of FIG. 2.
Figure 2:
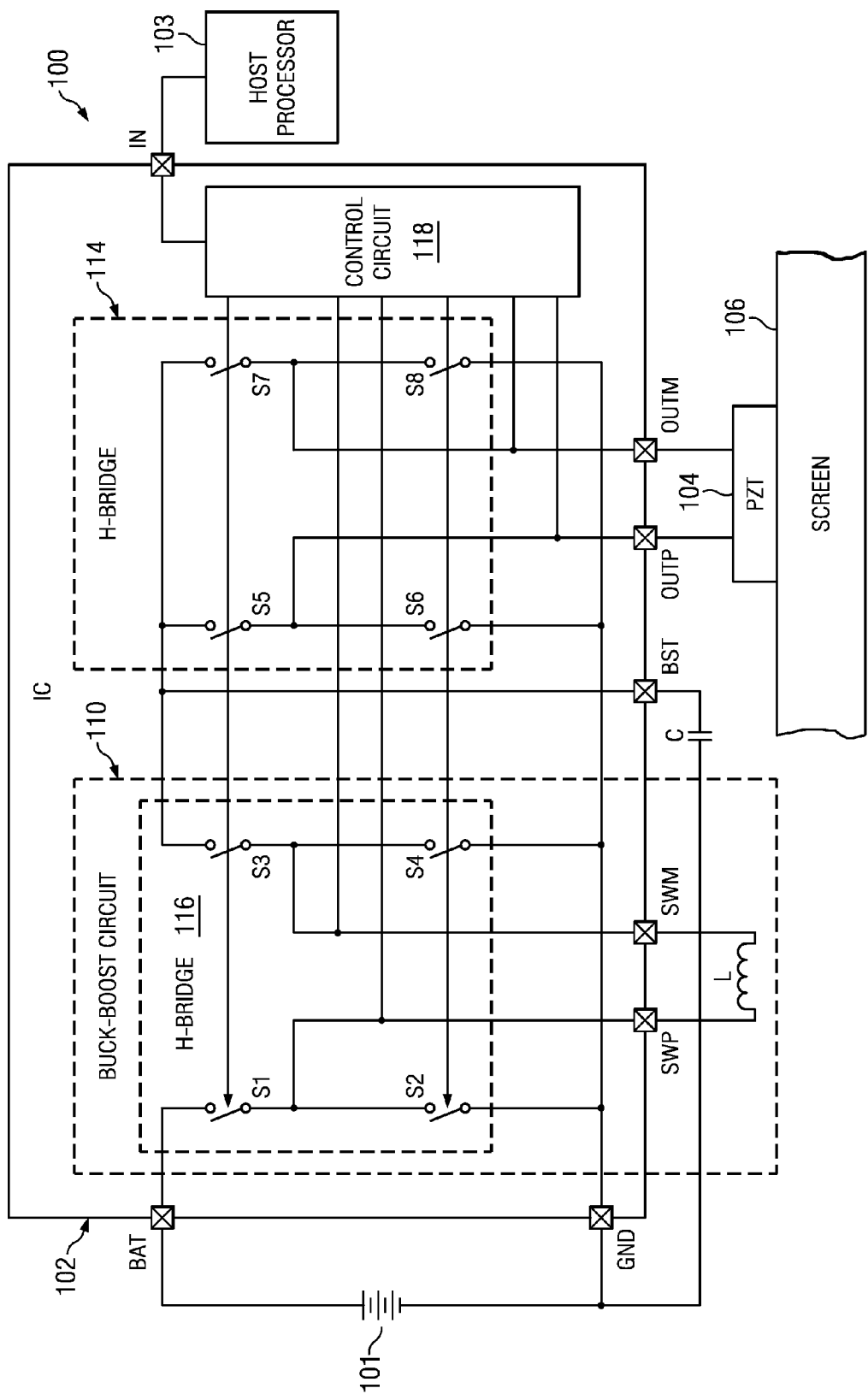
FIG. 2 is a diagram of an example of a system in accordance with the present invention.

Turning to FIGS. 2 and 3, an example of a system 100 in accordance with the present invention can be seen. In this example, the system 100 can be a mobile device (such as a mobile phone) having a host process 103 that can provide signals to the integrated circuit (IC) 102, which generally functions as a piezoelectric driver for a piezoelectric transducer or PZT 104. Based on the input signal (received through pin or terminal IN), the control circuit 118 can provide control signals to switches S1 to S4 and S5 to S8 of H-bridges 114 and 116, respectively, to cause the PZT 104 to, for example, vibrate the screen 106 or the chassis of a mobile device (e.g., mobile phone) to generate an audio signal or haptics effect. Thus, IC 102 is able to drive the PZT 104 substantially within the entire audio band (e.g., between about 50 Hz to about 20 kHz).

Generally, in operation, the H-bridge 116 is responsible for "driving" PZT 104 by providing the appropriate power and frequency. As shown in the example of FIG. 2, H-bridge 116 (which, as shown, includes switches S1 to S4) is coupled to inductor L through terminals SWP and SWM, functions as a buck-boost circuit 110. In operation, the interface circuit 212 of the control circuit 118 receives a control signal from host processor 103 through terminal IN (which could be an analog or multi-bit digital bus) indicating the desired power output and frequency of the response of the PZT 104. Based on the outputs from the interface circuit 212 and the buck-boost detector 204 (which can perform current and/or voltage detection from terminals SWP, SWM and BST), buck-boost controller 208 controls the pulse width modulator (PWM) 210 (which can, for example, operate at a switching frequency of about 10 MHz) to generate a PWM signal that the driver can use to activate and deactivate switches S1 to S4. As a result of these switching operations, the buck-boost circuit 110 can deliver (or recover) the appropriate charge to (or from) capacitor C from (or to) cell 101 (which is coupled to the H-bridge 116 at terminals BAT and GND) at the appropriate time.

Figure 4:
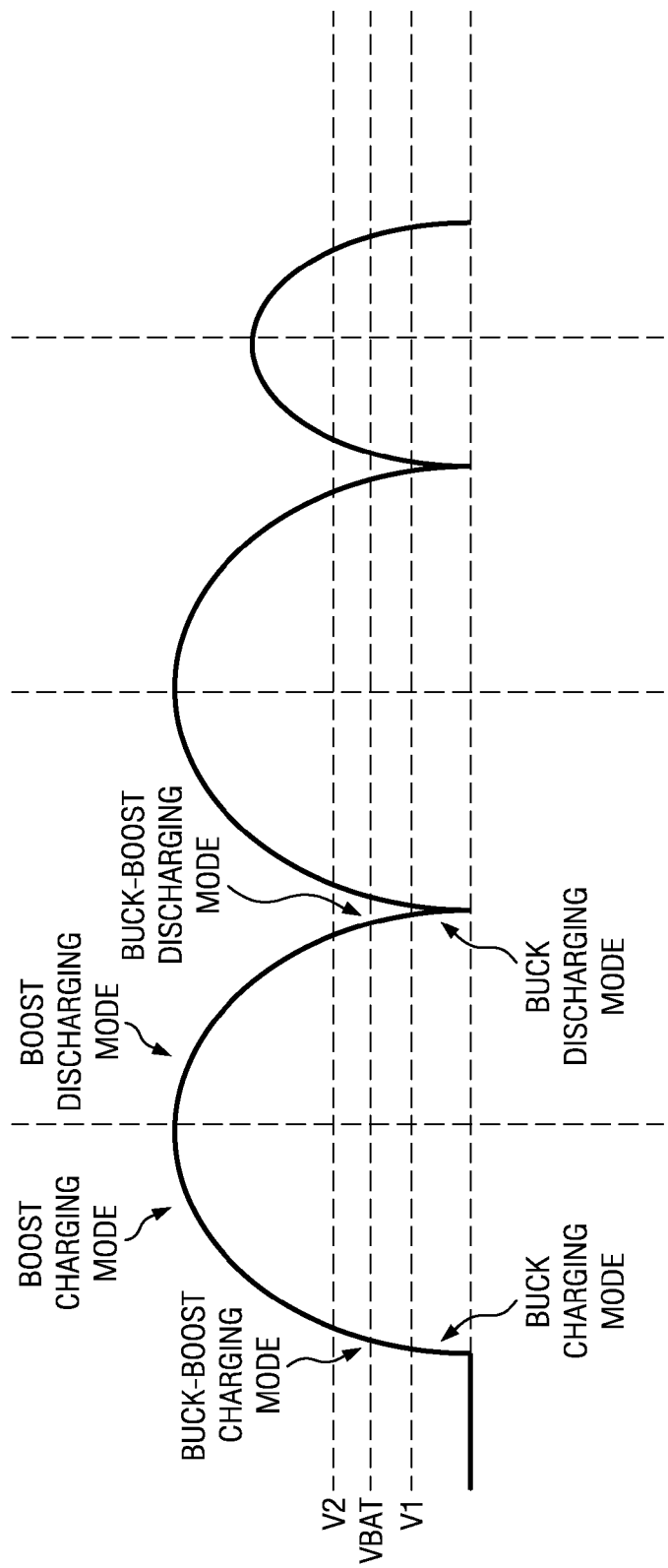
FIG. 4 is a diagram depicting an example operation of the buck-boost circuit of FIG. 2.

Turning to FIG. 4, an example of the operation of buck-boost circuit 110 can be seen. As shown, the buck-boost circuit 110 can deliver positive sinusoidal "peaks" at the terminal BST that can vary in both amplitude and frequency (where the amplitude and frequency are based on the signal provided by the host processor 103). This is generally accomplished by operating the buck-boost circuit 110 in several modes. These modes can generally be differentiated by threshold voltages V1 and V2, whether charge is being built on capacitor C or whether capacitor C is being discharged.

Figure 5A:
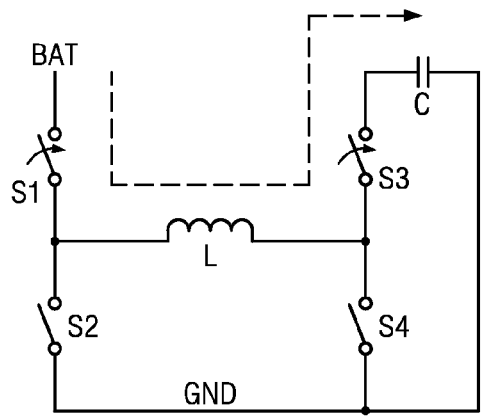
FIGS. 5A and 5B are diagrams depicting an example of a buck charging mode for the buck-boost stage of FIG. 2.
Figure 5B:
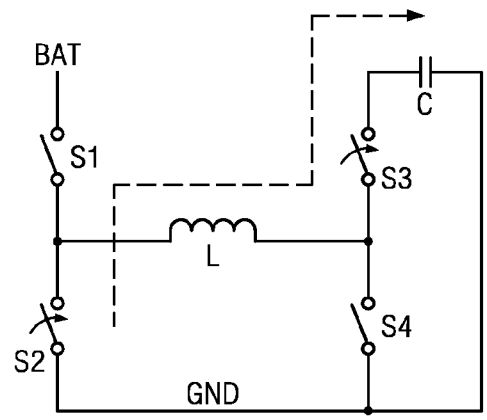
Figure 6A:
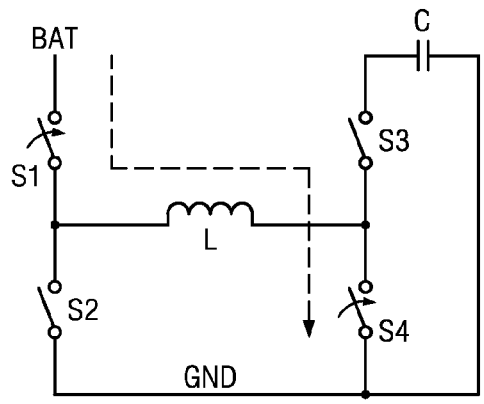
FIGS. 6A and 6B are diagrams depicting an example of a boost charging mode for the buck-boost stage of FIG. 2.
Figure 6B:
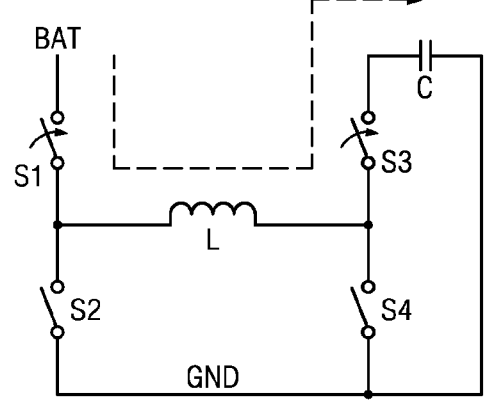
Figure 7A:
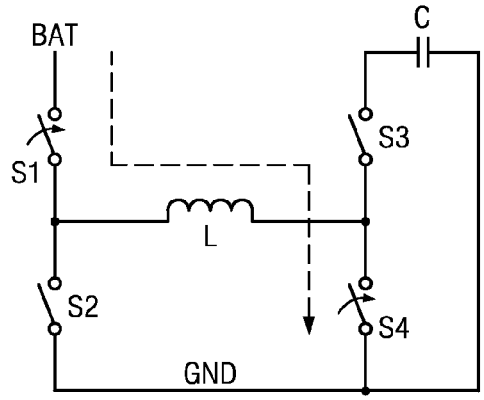
FIGS. 7A and 7B are diagrams depicting an example of a buck-boost charging mode for the buck-boost stage of FIG. 2.
Figure 7B:
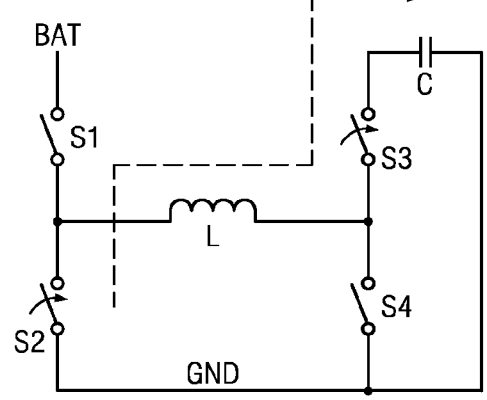

Turning first to charging modes, there can, for example, be three modes (as shown in FIGS. 5A to 7B), that allow for a charge to be built onto capacitor C as a function of the desired voltage on terminal BST. For voltages on terminal BST that are less than threshold voltage V1 (which can, for example, be about 80% of the supply voltage VBAT from cell 101), a buck charging mode is employed. For this mode, switch S4 is open or "off" and switch S3 is closed or "on." In the initial state (as shown in FIG. 5A), switch S1 is closed; then (as shown in FIG. 5B), switch S2 is closed in the subsequent state. For voltages on terminal BST that are greater than threshold voltage V2 (which can, for example, be about 120% of the supply voltage VBAT), a boost charging mode is employed. For this mode, switch S2 is open or "off" and switch S1 is closed or "on." In the initial state (as shown in FIG. 6A), switch S4 is closed; then (as shown in FIG. 6B), switch S3 is closed in the subsequent state. For voltages on terminal BST between threshold voltage V1 and V2, a buck-boost charging mode is employed. In the initial state (as shown in FIG. 7A), switches S1 and S4 are closed; then (as shown in FIG. 7B), switches S2 and S3 are closed in the subsequent state.

Figure 8A:
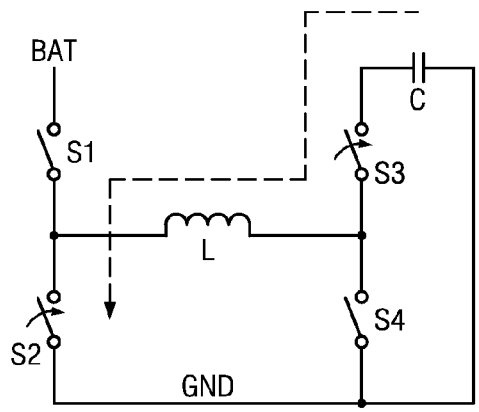
FIGS. 8A and 8B are diagrams depicting an example of a buck-boost discharging mode for the buck-boost stage of FIG. 2.
Figure 8B:
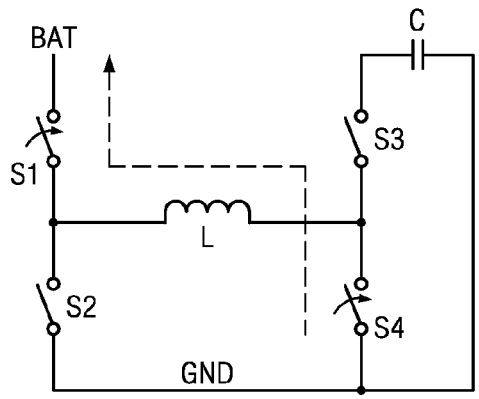
Figure 9A:
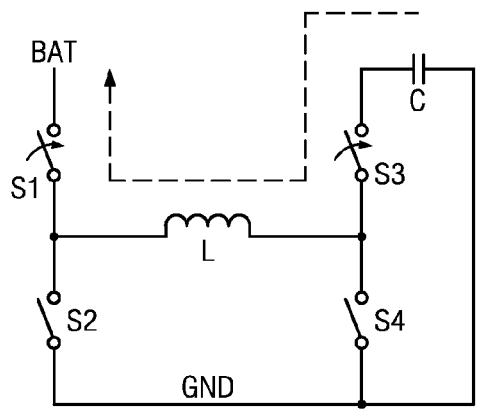
FIGS. 9A and 9B are diagrams depicting an example of a boost discharging mode for the buck-boost stage of FIG. 2.
Figure 9B:
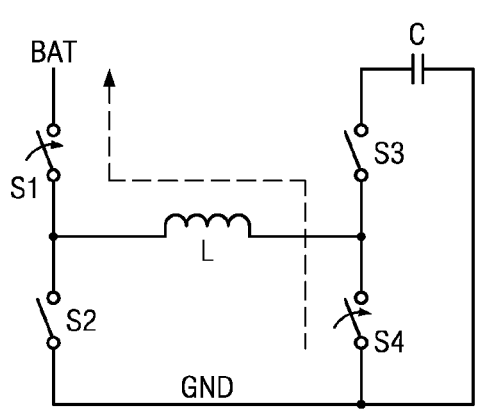
Figure 10A:
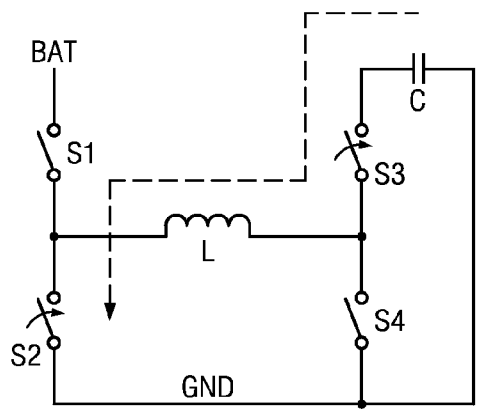
FIGS. 10A and 10B are diagrams depicting an example of a buck discharging mode for the buck-boost stage of FIG. 2.
Figure 10B:
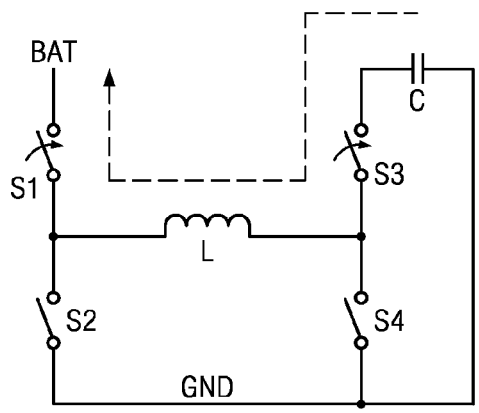

With the discharging modes, charge is recovered from the capacitor C and provided to cell 101. To do this, there can, for example, be three modes (as shown in FIGS. 8A to 10B), that allow for a charge to be discharged from capacitor C as a function of the desired voltage on terminal BST. For voltages on terminal BST between threshold voltage V1 and V2, a buck-boost discharging mode is employed. In the initial state (as shown in FIG. 8A), switches S2 and S3 are closed or "on"; then (as shown in FIG. 8B), switches S1 and S4 are closed or "on" in the subsequent state. For voltages on terminal BST that are greater than threshold voltage V2, a boost discharging mode is employed. For this mode, switch S2 is open or "off" and switch S1 is closed or "on." In the initial state (as shown in FIG. 9A), switch S3 is closed or "on"; then (as shown in FIG. 9B), switch S4 is closed or "on" in the subsequent state. For voltages on terminal BST that are less than threshold voltage V1, a buck discharging mode is employed. For this mode, switch S4 is open or "off" and switch S3 is closed or "on." In the initial state (as shown in FIG. 10A), switch S2 is closed or "on"; then (as shown in FIG. 10B), switch S1 is closed or "on" in the subsequent state.

Figure 11:
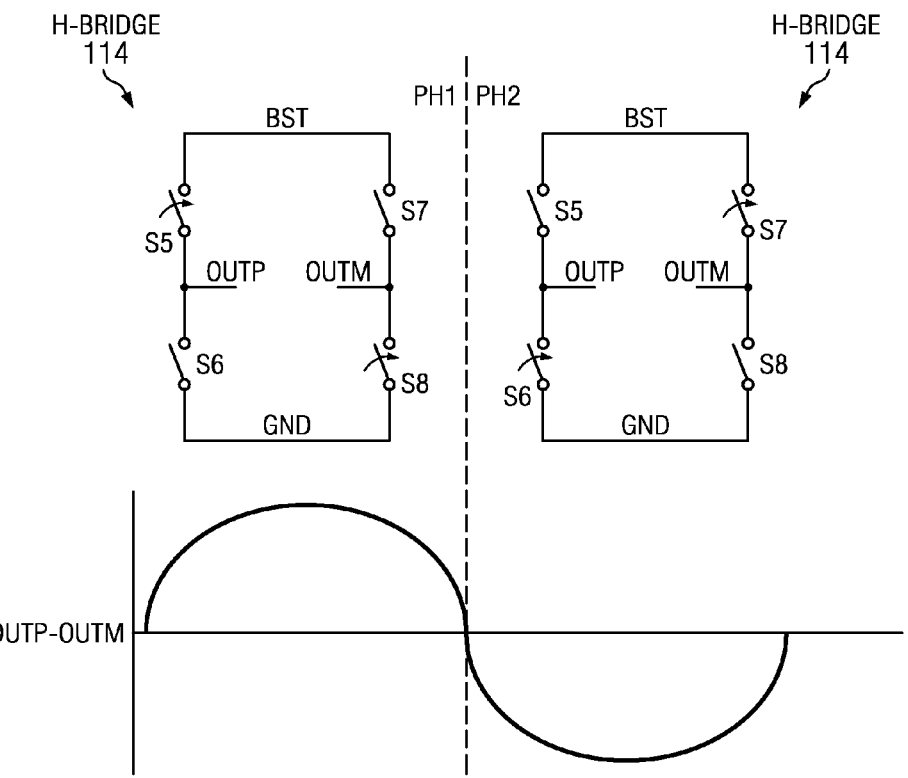
FIG. 11 is a diagram depicting an example operation of the H-bridge circuit of FIG. 2.

Because the voltage on terminal BST is a positive rectified sinusoid, H-bridge 114 can be employed to generate an appropriate drive signal to PZT 104. When controlling H-bridge 114 (which, as shown, includes switches S5 to S8), the control circuit 118 changes the state of H-bridge 114 with zero-crossings. This, as shown in this example, allows H-bridge 114 to differentially drive PZT 104 through pins or terminals OUTP and OUTM, and a zero-crossing detector 202 (as shown in FIG. 3) is able to detect zero-crossing events on terminals OUTP and OUTM. When a zero-crossing event occurs the bridge controller 203 is able to control the driver 206-1 (which appropriately activates and deactivates switches S5 to S8). Typically, as shown in the example of FIG. 11, for a positive swing signals, switches S5 and S8 are closed or activated (while switches S7 and S6 are open or deactivated) allowing current to flow from the capacitor C (which is coupled to terminal BST) to the PZT 104. Then, switches S6 and S7 are closed or activated (while switches S5 and S8 are open or deactivated) for negative swing signals. This allows PZT 104 to be sinusoidally driven from capacitor C and cell 101 (through H-Bridge 116).

Figure 12:
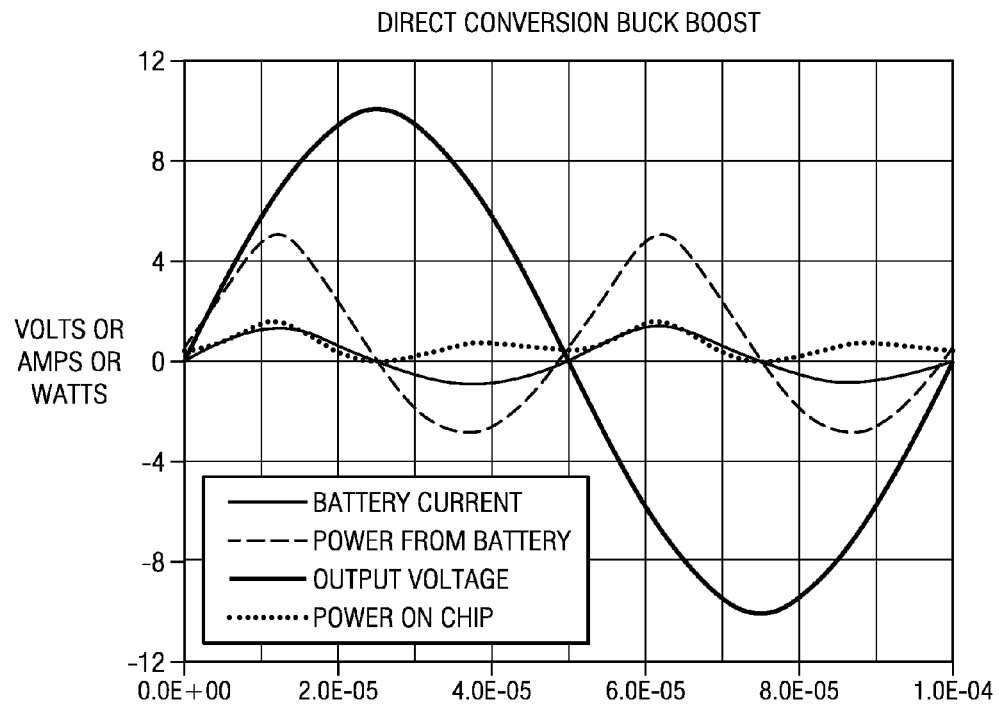
FIG. 12 is a diagram depicting the operation for the driver of FIG. 2.

As a result of using driver 100, the PZT 104 can be efficiently driven so as to allow it to operate as a haptics actuator and as a speaker. As shown in FIG. 12, for a 10 KHz signal with a peak-to-peak voltage of 20V (where PZT is 1 µF and the voltage VBAT is 3.6V), the average battery current is about 150 mA. This is comparable to the performance of the conventional circuit for FIG. 1, but there are fewer external components (namely, fewer inductors), significantly reducing the cost of the system.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a host processor;
    a cell;
    a capacitor that is coupled to the cell;
    an inductor;
    a piezoelectric transducer; and
    a piezoelectric driver having:
        an input terminal that is coupled to the host processor;
        a supply terminal;
        a first switching terminal;
        a second switching terminal, wherein the first and second switching terminals are configured to be coupled to an inductor;
        a boost terminal that is configured to be coupled to a capacitor;
        a first output terminal;
        a second output terminal, wherein the first and second output terminals are configured to be coupled to a piezoelectric transducer;
        a first H-bridge that is coupled to the supply terminal, the boost terminal, the first switching terminal, and the second switching terminal;
        a second H-bridge that is coupled to the boost terminal, the first output terminal, and the second output terminal; and
        a control circuit that is coupled to control the first and second H-bridges, wherein the control circuit is configured to operate the first H-bridge as a buck-boost circuit, and wherein the control circuit is configured to operate the first and second H-bridges to drive substantially within the audio band.

2. The apparatus of claim 1, wherein the control circuit is configured to operate the first H-bridge in a buck mode when a desired voltage on the capacitor is less than a first threshold voltage, in a boost mode when the desired voltage on the capacitor is greater than a second threshold voltage, and in a buck-boost mode when the desired voltage on the capacitor is between the first and second threshold voltages.

3. The apparatus of claim 2, wherein the first H-bridge further comprises first, second, third, and fourth switches, and wherein the second H-bridge further comprises fifth, sixth, seventh, and eighth switches.

4. The apparatus of claim 3, wherein the control circuit further comprises:
    a zero-crossing detector that is coupled to the first and second output terminals;
    a bridge controller that is coupled to the zero-crossing detector; and
    a driver that is coupled to the bridge controller, the fifth switch, the sixth switch, the seventh switch, and the eighth switch.

5. The apparatus of claim 4, wherein the driver further comprises a first driver, and wherein the control circuit further comprises:
    a buck-boost detector that is coupled to the first and second switching terminals;
    a buck-boost controller that is coupled to the buck-boost detector;

a pulse width modulator (PWM) that is coupled to the buck-boost controller; and a second driver that is coupled to the PWM, the first switch, the second switch, the third switch, and the fourth switch.

6. An apparatus comprising:

a host processor;

a cell;

a capacitor that is coupled to the cell;

an inductor;

a piezoelectric transducer; and a piezoelectric driver having:

an input terminal that is coupled to the host processor;

a first supply terminal that is coupled to the cell;

a second supply terminal that is coupled to the cell;

a first switching terminal that is coupled to the inductor;

a second switching terminal that is coupled to the inductor;

a boost terminal that is coupled to the capacitor;

a first output terminal that is coupled to the piezoelectric transducer;

a second output terminal that is coupled to the piezoelectric transducer;

a first H-bridge that is coupled to the first supply terminal, the second supply terminal, the boost terminal, the first switching terminal, and the second switching terminal;

a second H-bridge that is coupled to the boost terminal, the second supply terminal, the first output terminal, and the second output terminal; and a control circuit that is coupled to control the first and second H-bridges, wherein the control circuit is configured to operate the first H-bridge as a buck-boost circuit, and wherein the control circuit is configured to operate the first and second H-bridges to drive substantially within the audio band.

7. The apparatus of claim 6, wherein the control circuit is configured to operate the first H-bridge in a buck mode when a desired voltage on the capacitor is less than a first threshold voltage, in a boost mode when the desired voltage on the capacitor is greater than a second threshold voltage, and in a buck-boost mode when the desired voltage on the capacitor is between the first and second threshold voltages.

8. The apparatus of claim 7, wherein the first H-bridge further comprises first, second, third, and fourth switches, and wherein the second H-bridge further comprises fifth, sixth, seventh, and eighth switches.

9. The apparatus of claim 8, wherein the control circuit further comprises:

a zero-crossing detector that is coupled to the first and second output terminals;

a bridge controller that is coupled to the zero-crossing detector; and a driver that is coupled to the bridge controller, the fifth switch, the sixth switch, the seventh switch, and the eighth switch.

10. The apparatus of claim 9, wherein the piezoelectric transducer is coupled to a screen, and wherein the driver further comprises a first driver, and wherein the control circuit further comprises:

a buck-boost detector that is coupled to the first and second switching terminals;

a buck-boost controller that is coupled to the buck-boost detector;

a PWM that is coupled to the buck-boost controller;

a second driver that is coupled to the PWM, the first switch, the second switch, the third switch, and the fourth switch; and an interface circuit that is coupled to the buck-boost controller and the host controller.

* * * * *